United States Patent
Kondo et al.

(10) Patent No.: US 7,576,288 B2
(45) Date of Patent: Aug. 18, 2009

(54) CIRCUIT BOARD, MULTI-LAYER WIRING BOARDS, METHOD OF PRODUCING CIRCUIT BOARDS AND METHOD OF PRODUCING MULTILAYER WIRING BOARDS

(75) Inventors: Masayoshi Kondo, Akita (JP); Masaaki Kato, Akita (JP); Toshiaki Chuma, Akita (JP); Satoru Nakao, Akita (JP); Kentaro Fujiura, Akita (JP)

(73) Assignee: Sumitomo Bakelite Company Limited (JP)

( * ) Notice: Subject to any disclaimer, the term of this patent is extended or adjusted under 35 U.S.C. 154(b) by 227 days.

(21) Appl. No.: 10/534,962

(22) PCT Filed: Nov. 19, 2003

(86) PCT No.: PCT/JP03/14741

§ 371 (c)(1),
(2), (4) Date: May 16, 2005

(87) PCT Pub. No.: WO2004/049772

PCT Pub. Date: Jun. 10, 2004

(65) Prior Publication Data

US 2006/0042826 A1  Mar. 2, 2006

(30) Foreign Application Priority Data

Nov. 27, 2002  (JP)  ............................. 2002-344568

(51) Int. Cl.
*H05K 1/00* (2006.01)
(52) U.S. Cl. .................. 174/254; 174/255; 174/262
(58) Field of Classification Search .............. 174/255, 174/262
See application file for complete search history.

(56) References Cited

U.S. PATENT DOCUMENTS

| | | | | |
|---|---|---|---|---|
| 3,471,348 | A * | 10/1969 | Iles et al. ..................... 216/18 |
| 4,338,149 | A * | 7/1982 | Quaschner ................... 156/248 |
| 4,800,461 | A * | 1/1989 | Dixon et al. ................. 361/751 |
| 5,128,746 | A * | 7/1992 | Pennisi et al. ............... 257/738 |
| 5,401,913 | A | 3/1995 | Gerber et al. |
| 6,187,652 | B1 | 2/2001 | Chou et al. |
| 6,395,993 | B1 * | 5/2002 | Nakamura et al. .......... 174/254 |
| 6,570,098 | B2 * | 5/2003 | Shimizu et al. ............. 174/255 |
| 6,586,686 | B1 * | 7/2003 | Enomoto et al. ............ 174/262 |
| 2001/0040794 | A1 | 11/2001 | Shimizu |

FOREIGN PATENT DOCUMENTS

| | | |
|---|---|---|
| EP | 1395101 | 3/2004 |
| JP | 7-135375 | 5/1995 |
| JP | 11-54934 | 2/1999 |
| JP | 2002-329966 | 11/2002 |

* cited by examiner

*Primary Examiner*—Ishwar (I. B.) Patel
(74) *Attorney, Agent, or Firm*—Smith Gambrell & Russell

(57) ABSTRACT

A multilayer flexible wiring board including (1) plural single-sided wiring boards each having a wiring pattern on one side of the corresponding substrate and two-layer conductor posts projecting from the wiring pattern to the side of the substrate opposite from the wiring pattern, wherein the substrates other than that of the outermost layer have the pads to be connected to the two-layer conductor posts on the side opposite from the conductor posts, and the wiring pattern has no surface coating; (2) a flexible wiring board having on at least one side thereof the pads for connection to the conductor posts and including a wiring pattern with surface coating applied on the flexible portion but no surface coating applied on the multilayer portion, and (3) an adhesive layer having a flux function, wherein the conductor posts and pads are connected by a metal or an alloy, and the wiring patterns are electrically connected.

7 Claims, 5 Drawing Sheets

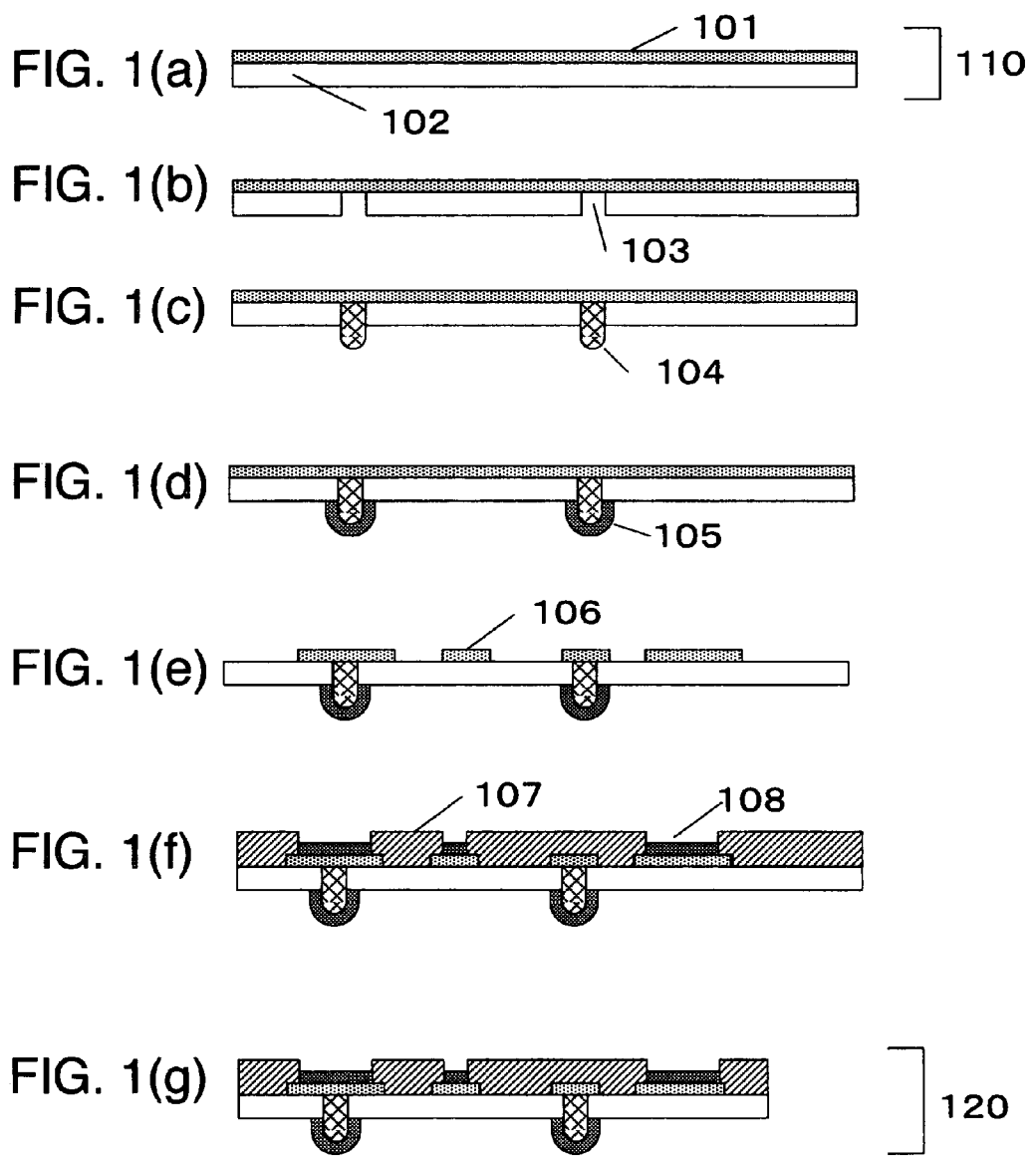

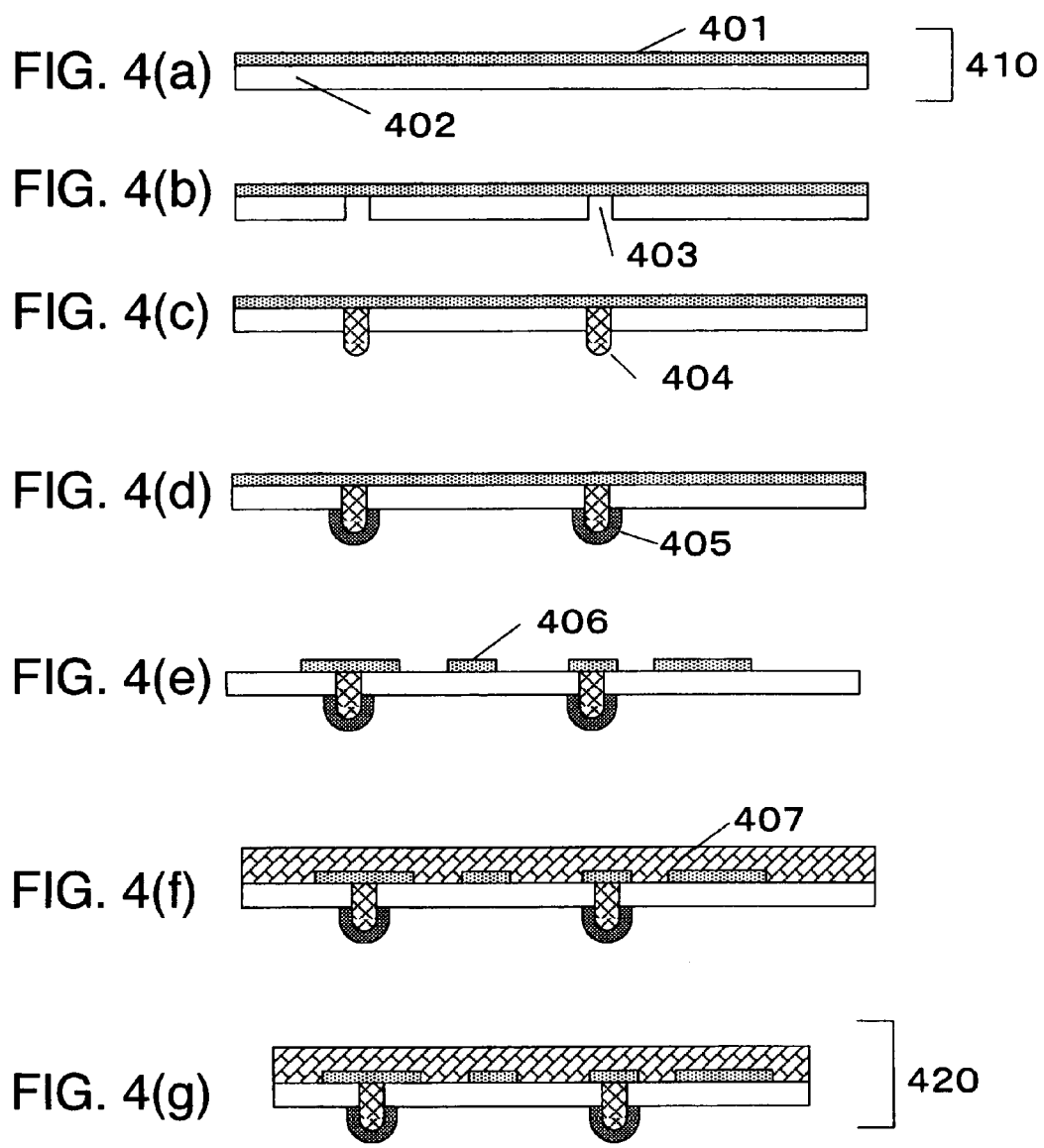

CIRCUIT BOARD, MULTI-LAYER WIRING BOARDS, METHOD OF PRODUCING CIRCUIT BOARDS AND METHOD OF PRODUCING MULTILAYER WIRING BOARDS

TECHNICAL FIELD

The present invention relates to circuit boards, multilayer wiring boards, a method of producing the circuit boards, and a method of producing the multilayer wiring boards. More particularly, it relates to multilayer flexible printed wiring boards used as a part of electronic equipment, circuit boards forming a component of such multilayer wiring boards, and methods of producing these boards.

BACKGROUND ART

With enhancement of packaging density of electronic equipment in recent years, progress has also been made in layer multiplication of the printed wiring boards used in such electronic equipment and use of the flexible wiring boards of a multilayer structure is gaining ground. The printed wiring board is a rigid-flexible wiring board which is a composite of a flexible wiring board and a rigid wiring board, and the range of its use is expanding.

The following methods have been proposed for producing the multilayer flexible wiring boards or rigid-flexible wiring boards: The patterned copper foils and the insulating layers are placed one on the other alternately to form a laminate, then the through-holes for interlaminar connection are formed in the said laminate, and after applying plating for interlaminar connection on the said through-holes, working of the outermost layer circuits, etc., is conducted; On the insulator side of each single-sided wiring board are formed the holes which do not penetrate the copper foil, then conductor posts are formed with a metal or an alloy, followed by surface coating of the whole layers, and an adhesive layer and each wiring board are press bonded, with the above operations being repeated a necessary number of times for effectuating the desired layer multiplication. (See, for example, JP-A-11-54934.)

In the former method, interlaminar connection is made by forming the through-holes in such a way that they pierce through all the layers. However, this connecting method, although simple in working, is subject to many restrictions on circuit designing. The greatest drawback of this method is that since all the layers are connected by through-holes, the through-holes formed in the outermost layers are increased in number and also the areal ratio occupied by the through-hole lands elevates, making it unable to raise the circuit density which is essential for dense packaging of parts and circuit patterning. Also, high-density packaging and patterning, for which the market demand is expected to rise in the future, would become works of more complex specifications. With further advance of miniaturization and densification of the packaged parts, the layer connecting lands and through-holes need to be formed at a same location through the layers, so that the wiring density becomes deficient in design, giving rise to the problems in packaging of the parts.

In the conventional production methods of the flexible wiring boards, in order to reduce the production cost, they are manufactured by arranging plural patterns on a single sheet. It is possible to produce the multilayer flexible wiring boards, too, at low cost by using the same method. According to this method, however, if any defective pattern exists in the sheet, the multilayer flexible wiring board having such a defective pattern in the laminate also become defective, causing a reduction of process yield in the laminating process. The greatest difference between the multilayer flexible or rigid-flexible wiring board and the multilayer rigid wiring board is that the former has a flexible portion while the latter does not. In construction of this flexible portion, it needs to eliminate the outer layers so that the flexible portion won't be laminated or to remove the outer layers after lamination, so that a drop of material yield is inevitable in sheet lamination. Further, in the case of designing the different sizes of patterns for the respective layers, the number of the patterns that can be formed per sheet is restricted by the number of the maximum size patterns, resulting in an unsatisfactory pattering ratio and a low material yield.

In the latter production method, there are included the steps of specific operations for boring the substrate on the conductor post receiving side by laser, applying a desmearing treatment and forming openings in the surface coating, so that there exist the problems on the establishment of techniques for these specific operations and reduction of yield. There also is the problem that as the number of the structural layers increases, a longer time and higher cost are necessitated for the production and further the material cost for the surface coating elevates.

DISCLOSURE OF INVENTION

The present invention, in order to eliminate the above problems, envisions to provide the multilayer flexible wiring boards which are easy to manufacture and capable of making interlaminar connection with certainty, have high reliability and allow lamination of the outer layer wiring-boards, and a method of producing such multilayer flexible wiring boards.

The above object of the present invention can be fulfilled by implementing the following embodiments (1) to (22) of the invention.

(1) A circuit board comprising:
    an insulated substrate;
    a conductor circuit formed on one side of said substrate; and
    two-layer conductor posts electrically connected to said conductor circuit;
    wherein each of said two-layer conductor posts is formed in a hole piercing said insulated substrate and comprises a projecting terminal having its one end connected to said two-layer conductor circuit and its other end projecting from the other side of said insulated substrate, and a metal coating layer covering the portion of said terminal that projects out from the other side of said insulated substrate.

(2) A circuit board as set forth in (1) wherein the metal coating layer is composed of at least one metal selected from the group consisting of gold, silver, nickel, tin, lead, zinc, bismuth, antimony and copper, or an alloy containing such metals.

(3) A circuit board comprising:
    an insulated substrate;
    a conductor circuit formed on one side of said insulated substrate; and
    two-layer conductor posts electrically connected to said conductor circuit;
    wherein an adhesive layer having a function of flux is provided on one or both sides of said insulated substrate.

(4) A circuit board comprising:
    an insulated substrate;
    a conductor circuit formed on one side of said insulated substrate; and two-layer conductor posts electrically connected to said conductor circuit;

wherein a surface coating is provided on one side of said insulated substrate, said coating covering said conductor circuit with a part thereof left uncovered, and an adhesive layer having a flux function is provided on the other side of said insulated substrate.

(5) A circuit board as set forth in any one of (1) to (4) wherein said two-layer conductor posts contain copper and a metal or copper and an alloy.

(6) A circuit board as set forth in (3) or (4) wherein each of said two-layer conductor posts is formed in a hole piercing said insulated substrate, and comprises a protruding terminal of which one end is connected to said conductor circuit and the other end projects from the other side of said insulated substrate, and a metal coating layer covering the portion of said protruding terminal which projects from the other side of said insulated substrate.

(7) A circuit board as set forth in (6) wherein said metal coating layer is made of at least one metal selected from the group consisting of gold, silver, nickel, tin, lead, zinc, bismuth, antimony and copper, or an alloy containing such metals.

(8) A multilayer wiring board comprising a laminate of plural circuit boards including the one set forth in (1) or (2).

(9) A multilayer wiring board comprising a laminate of plural circuit boards including the one set forth in (3) or (4).

(10) A multilayer wiring board comprising a laminate of plural circuit boards including the one set forth in any one of (1) to (4) and a circuit board comprising:
an insulated substrate;
a conductor circuit formed on both sides of said insulated substrate;
a metallic layer formed covering a part of said conductor circuit; and
a surface coating covering the portion of said conductor circuit other than said metallic layer.

(11) A multilayer wiring board comprising a laminate of plural circuit boards including the one set forth in (1) or (2), the one set forth in (3) or (4), and a circuit board comprising:
an insulated substrate;
a conductor circuit formed on both sides of said insulated substrate;
a metallic layer formed covering a part of said conductor circuit; and
a surface coating covering the portion of said conductor circuit other than said metallic layer.

(12) A multilayer wiring board in which the circuit board set forth in any one of (1) to (4) is joined to both sides of another circuit board set forth below, and the conductor circuits of the respective circuit boards are electrically connected at the specified sites through said conductor posts, said another circuit board comprising:
an insulated substrate;
a conductor circuit formed on both sides of said insulated substrate;
a metallic layer formed covering a part of said conductor circuit; and
a surface coating covering the portion of said conductor circuit other than said metallic layer.

(13) A multilayer wiring board in which a circuit board set forth in (3) or (4) is joined to both sides of another circuit board set forth below, a circuit board set forth in (1) or (2) is joined to said both circuit boards, and the conductor circuits of the respective circuit boards are electrically connected at the specified positions through said conductor posts, said another circuit board comprising:
an insulated substrate;
a conductor circuit formed on both sides of said insulated substrate;
a metallic layer formed covering a part of said conductor circuit; and
a surface coat covering the portion of said conductor circuit other than said metallic layer.

(14) A multilayer wiring board as set forth in any one of (11) to (13) wherein said surface coating includes an adhesive layer.

(15) A multilayer wiring board as set forth in (7) having a multilayer portion comprising a laminate of plural circuit boards, and a single-layer portion to which at least one circuit board in said multilayer portion extends therefrom.

(16) A multilayer wiring board as set forth in (15) wherein the circuit board constituting said single-layer portion is a flexible circuit board.

(17) A multilayer flexible wiring board comprising (i) plural single-sided wiring boards having a wiring pattern formed on one side of a substrate made of an insulating material and two-layer conductor posts made of copper and a metal or copper and an alloy, each said conductor post projecting from said wiring pattern to the side of said substrate opposite from said wiring pattern, with the substrates other than that of the outermost layer having, on the side opposite from said conductor posts, the pads for making connection to the conductor posts, and said wiring pattern having no surface coating, (ii) a flexible wiring board having on at least one side thereof the pads for connection to said conductor posts and comprising a wiring pattern with surface coating applied on the flexible portion but no surface coating applied on the multilayer portion, and (iii) an adhesive layer having a flux function whereby the respective boards are laminated integrally, wherein said conductor posts and pads are connected by a metal or an alloy through the medium of said adhesive layer, and said wiring patterns are electrically connected.

(18) A multilayer flexible wiring board as set forth in (17) wherein said flexible wiring board is a severed individual piece.

(19) A multilayer flexible printed wiring board as set forth in (17) or (18) wherein the metal is at least one of gold, silver, nickel, tin, lead, zinc, bismuth, antimony and copper.

(20) A multilayer flexible printed wiring board as set forth in any one of (17) to (19) wherein the alloy comprises at least two of tin, lead, silver, zinc, bismuth, antimony and copper.

(21) A method of producing a multilayer flexible wiring board comprising the steps of: boring a substrate made of an insulating material, and then forming on the bored side of said substrate the protruding two-layer conductor posts made of copper and a metal or copper and an alloy; forming a wiring pattern on the side of said substrate opposite from said two-layer conductor posts; forming an adhesive layer having a flux function over the whole surface of each of the substrates other than that of the outermost layer on the wiring pattern side having the pads opposite from said two-layer conductor post side by lamination or printing, thereby forming a single-sided wiring board; forming a flexible wiring board comprising a wiring pattern having on at least one side thereof the pads for joining to said two-layer conductor posts; forming an adhesive layer having a flux function on the wiring pattern side having the pads of said flexible wiring board over the whole surface or partially thereof by lamination or printing; and heat-press bonding said two-layer conductor posts and said pads through the medium of said adhesive layer.

(22) Multilayer flexible wiring boards that can be obtained from the method set forth in (21).

BRIEF DESCRIPTION OF THE DRAWINGS

FIGS. 1(a) to 1(g) are the sectional views for illustrating a single-sided wiring board that forms the outermost layer used in the present invention and a process for producing it.

FIGS. 4(a) to 4(g) are the sectional views for illustrating a single-sided wiring board that forms the inner layers used in the present invention and a process for producing it.

Figure 2A:
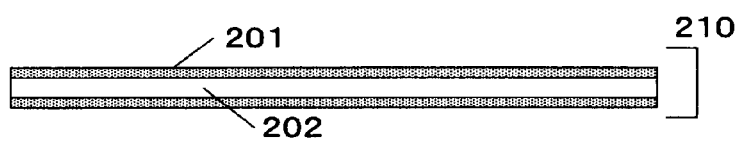
FIGS. 2(a) to 2(e) are the sectional views for illustrating a flexible wiring board used in the present invention and a process for producing it.
Figure 2B:
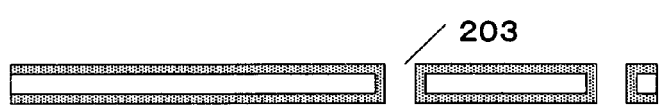

The reference numerals used in the drawings designate the following:

101, 201, 401: copper foil
102, 202, 402: substrate
205, 406: wiring pattern
107, 206: surface coating
108: opening in surface coating
103, 403: opening in substrate
105, 405: two-layer conductor post
104, 404: copper post
110: single-sided laminate
106, 204: pad
207, 407: adhesive layer having a function as a flux
120: outer layer single-sided wiring board
203: through-hole
210: double-sided board
220: interlayer flexible wiring board
310: multilayer (four-layer) flexible wiring board
320, 520: multilayer portion
330, 530: flexible portion
410: single-sided laminate
420: interlayer single-sided wiring board
510: multilayer (six-layer) flexible wiring board

EMBODIMENTS OF THE INVENTION

The present invention will be described regarding the embodiments thereof with reference to the accompanying drawings, but it should be understood that these embodiments are merely intended to be illustrative and not to be construed as limiting the scope of the invention in any way.

FIGS. 1 to 5 are the drawings illustrating the examples of the multilayer flexible wiring boards embodying the present invention and the manufacturing methods thereof. FIG. 3(b) and FIG. 5(b) are the sectional views showing the structure of the multilayer flexible wiring boards obtained according to the present invention, with FIG. 3(b) showing a four-layer flexible wiring board 310 having a multilayer portion 320 and a flexible portion 330, and FIG. 5(b) showing a six-layer flexible wiring board 510 having a multilayer portion 520 and a flexible portion 530.

For explaining the producing methods of the multilayer flexible wiring boards according to the present invention, first a process for producing an exemplary four-layer flexible wiring board is illustrated. The process can be divided into the following three steps A, B and C. In the step A (FIG. 1), the outer layer single-sided wiring boards 120 are formed. Then, in the step B (FIG. 2), an interlayer flexible wiring board 220 is formed, and finally in the step C (FIG. 3), the outer layer single-sided wiring boards 120 are laminated on the interlayer flexible wiring board 220 to complete a multilayer flexible wiring board 310.

For producing a wiring board with five or more layers, the single-sided wiring boards 120 made in the step A are used as the outermost layer wiring boards. For making the structure from the second to the center layer both-sided boards from the outside, the interlayer single-sided wiring boards 420 are formed in the step D (FIG. 4), with the interlayer flexible wiring board 220 formed in the step B being used as the center layer wiring board. In the step E, the interlayer single-sided wiring boards 420 are laminated on the interlayer flexible wiring board 220 which forms the center layer, and the single-sided wiring boards 120 are laminated thereon as the outermost layers to form a multilayer flexible wiring board 510. For producing a structure with five or more layers, a desired number of interlayer single-sided wiring boards 420 are laminated between each outermost layer single-sided wiring board 120 and the interlayer flexible wiring board 220 composing the center layer.

For making the outer layer single-sided wiring board 120 in the step A, there is first prepared a single-sided laminate 110 having a copper foil 101 deposited on one side of a substrate 102 comprising an insulating material obtained by curing a resin such as a polyimide or epoxy resin (FIG. 1(a)). It is to be noted here that for preventing smearing which is detrimental to conductor connection, preferably no adhesive layer is allowed to exist between the substrate and the copper foil for bonding them, although use of an adhesive for bonding is not always unacceptable. In the substrate 102, openings 103 are formed till the copper foil 101 is exposed (FIG. 1(b)). Such openings can be easily formed by the laser method which also allows formation of holes of small diameters. It is also preferable to remove the resin remaining in the substrate openings 103 by such a method as dry desmearing using an aqueous solution of potassium permanganate or plasma dry desmearing as this contributes to the enhancement of reliability of interlaminar connection. In each of these substrate openings 103, a two-layer conductor post 105 is formed projecting from the substrate 102 surface (FIG. 1(d)). The two-layer conductor post 104 can be formed by first forming a copper post 104 by a pasting or plating method (FIG. 1(c)) and then coating it with a metal or an alloy. As the metal, at least one of gold, silver, nickel, tin, lead, zinc, bismuth and antimony is used, and the post may be single layered or may have a structure of two or more layers. The alloy used here is a solder comprising two or more metals selected from tin, lead, silver, zinc, bismuth, antimony and copper. For instance, tin-lead, tin-silver, tin-zinc, tin-bismuth, tin-antimony, tin-silver-bismuth and tin-copper alloys can be used, but the solder used in the present invention is not restricted by the metal combination or composition and any optimal alloy can be selected for use. Thickness of the post is 0.05 μm or greater, preferably 0.5 μm or greater. Then the copper foil 101 on one side of the substrate 102 is etched to form a wiring pattern 106 (FIG. 1(e)), and a surface coating 107 is applied on the wiring pattern (FIG. 1(f)). This surface coating 107 can be formed by pasting an overlay film comprising an adhesive-applied insulating resin or by printing an ink directly on the substrate. In this surface coating 107 may be formed openings 108 for facilitating surface treatment-such as plating.

Figure 2C:
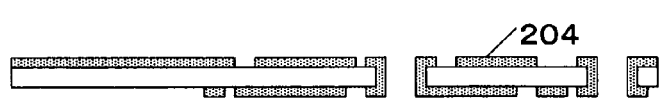
Figure 2D:
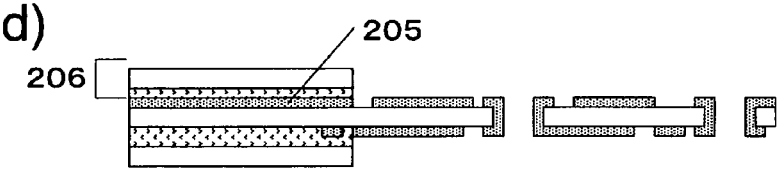
Figure 2E:
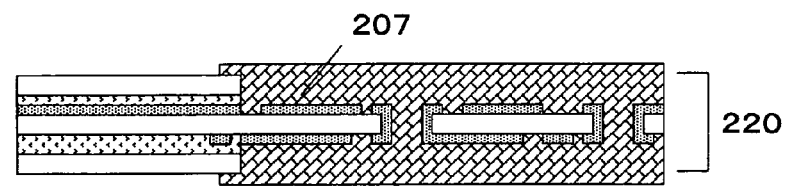

An adhesive layer having a flux function may be formed on the side of the substrate 102 where the two-layer conductor posts 105 project, but it is preferable for preventing oxidation of the wiring pattern 204 (FIG. 2(c)) to form the said adhesive layer on the interlayer flexible wiring board 220 (FIG. 2(e)) having the pads for connection to the conductor posts. The said adhesive layer having a flux function can be formed by various methods such as applying an adhesive having a flux function on the substrate 102 by a printing method, but it is more expedient to laminate a sheet of adhesive on the substrate 102. Finally, the work is properly cut according to the size of the multilayer portion to obtain an individual piece of outer layer single-sided wiring board 120 (FIG. 1(g)).

This outer layer single-sided wiring board 120 may also be obtained by first forming a wiring pattern 106 on a single-sided laminate 110, then forming the openings 103 in the substrate, and providing the two-layer conductor posts 105 and surface coating 107.

The adhesive having a flux function used in the present invention is an adhesive having a function to clean the metal surface, for example, a function to remove or reduce the oxide film present on the metal surface, and a primarily preferred adhesive composition comprises (A) a resin such as phenolic novolak resin having a phenolic hydroxyl group, cresol novolak resin, alkylphenolic novolak resin, cresol resin and polyvinylphenol resin, and (B) a curing agent for these resins. Examples of the curing agents usable here include phenol-based epoxy resins such as bisphenol-based, phenolic novolak-based, alkyklphenolic novolak-based, biphenol-based, naphthol-based and resorcinol-based ones, the epoxy resins epoxidized with an aliphatic, alicyclic or unsaturated aliphatic skeleton as base, and the isocyanate compounds.

The amount to be blended of a resin having a phenolic hydroxyl group is preferably 20 to 80% by weight in the whole adhesive. If its amount is less than 20% by weight, the activity of the composition to clean the metal surface is low, while if its amount exceeds 80% by weight, it is hardly possible to obtain a sufficiently cured product, resulting in a reduced bonding strength and reliability. On the other hand, the ratio of the resin or compound acting as a curing agent is preferably 20 to 80% by weight in the whole adhesive. The adhesive may contain where necessary various additives such as coloring matter, inorganic filler, various kinds of coupling agent, solvent, etc.

The secondarily preferred adhesive composition comprises (C) a phenol-based epoxy resin such as bisphenol-based, phenol novolak-based, alkylphenol novolak-based, biphenol-based, naphthol-based and resorcinol-based ones, or an epoxy resin epoxidized with an aliphatic, alicyclic or unsaturated aliphatic skeleton as base, and (D) a curing agent for said epoxy resins which has an imidazole ring. Examples of the curing agents having an imidazole ring are imidazole, 2-methylimidazole, 2-ethyl-4-methylimidazole, 2-phenylimidazole, 1-benzyl-2-methylimidazole, 2-undecylimidazole, 2-phenyl-4-methylimidazole, and bis(2-ethyl-4-methyl-imidazole).

The epoxy resin content is preferably 30 to 99% by weight in the whole adhesive. If its content is less than 30% by weight, a satisfactory cured product may not be obtained. The adhesive may contain, beside the said two components, a thermosetting or thermoplastic resin such as cyanate resin, acrylic resin, methacrylic resin and maleimide resin. If necessary, a coloring matter, inorganic filler, various kinds of coupling agent, solvent and such may also be added. The resin having an imidazole ring and acting as a curing agent for said epoxy resins is contained in an amount of 1 to 10% by weight in the whole adhesive. If its content is less than 1% by weight, the metal surface cleaning performance of the adhesive is unsatisfactory and the epoxy resin may not be sufficiently cured. If its content exceeds 10% by weight, the curing reaction may advance rapidly, causing deterioration of fluidity of the adhesive layer.

Various methods are available for preparing the adhesive. For instance, a solid resin (A) having a phenolic hydroxyl group and a solid resin (B) acting as a curing agent are dissolved in a solvent; a solid resin (A) having a phenolic hydroxyl group is dissolved in a liquid resin (B) acting as a curing agent; a solid resin (B) acting as a curing agent is dissolved in a liquid resin (A) having a phenolic hydroxyl group; or a resin (D) having an imidazole ring and acting as an epoxy resin curing agent is dispersed or dissolved in a solution prepared by dissolving a solid epoxy resin (C) in a solvent. As the solvent, acetone, methyl ethyl ketone, methyl isobutyl ketone, cyclohexane, toluene, butyl cellosolve, ethyl cellosolve, N-methylpyrrolidone, γ-butylactone and the like can be used. A solvent having a boiling point of 200° C. or below is preferably used.

A process for making an interlayer flexible wiring board 220 in the step B comprises the following procedure. A double-sided board 210 comprising a heat-resistant resin 202 commonly used for the flexible wiring boards such as a polyimide and copper foils 201 is prepared (FIG. 2(a)). This double-sided board 210 constitutes the flexible portion of the product multilayer flexible wiring board. Preferably no adhesive layer is allowed to exist between the copper foils 201 and the heat-resistant resin 202 for enhancing the flexing properties although the presence of such an adhesive layer is not always ruled out. The front and back sides of this double-sided board 210 are made electrically conductive by the through-holes 203 (FIG. 2(b)), and then the wiring pattern and the pads 204 capable of receiving the two-layer conductor posts 105 are formed by etching (FIG. 2(c)). After that, a surface coating 206 of a polyimide or the like is applied on the part of the wiring pattern 205 that corresponds to the flexible portion 330 (FIG. 2(d)) to for an interlayer flexible wiring board. Here, in order to improve wettability with the two-layer conductor post 105 to secure connection reliability, the wiring pattern 204 may be subjected to a surface treatment by plating or solder pasting with a metal or an alloy. The metal to be used here is not specified, but tin is preferred because of low melting point. The alloy used here is a solder comprising at least two metals selected from tin, lead, silver, zinc, bismuth, antimony and copper. For example, the combinations of tin/lead, tin/silver, tin/zinc, tin/bismuth, tin/antimony, tin/silver/bismuth, and tin/copper are suggested, but the solder usable in this invention is not restricted by the metal combination or composition and the best suited solder is selected and used. Then, an adhesive layer 207 having a flux function is formed on the part of the wiring pattern 204 corresponding to the multilayer portion 320 (FIG. 2(e)). The interlayer flexible wiring board may be cut into an individual piece before lamination.

Formation of a multilayer flexible wiring board 310 in the step C is accomplished by laying up an individual piece of outer layer single-sided wiring board 120 on both sides of an interlayer flexible wiring board 220. Positioning in this operation can be effected by a method in which positioning mark previously formed on the wiring pattern of each layer is read by an image recognizer, or a method in which positioning is conducted using the positioning pins. Then the work is heated to a temperature at which soldering is possible, and then pressed under heating until the two-layer conductor posts 105 and the pad portions 204 of the interlayer flexible wiring board 220 are soldered together with the flux-functioning adhesive layer 207 interposed between them, after which the work is reheated at a temperature which does not cause melting of the solder to cure the adhesive layer 207 and effect interlaminar adhesion, thereby effectuating lamination of the outer layer single-sided wiring boards 120 and the interlayer flexible wiring board 220 (FIG. 3(b)). Lamination of the respective layers can be accomplished, for instance, by vacuum pressing or a combination of hot lamination and baking.

Figure 3A:
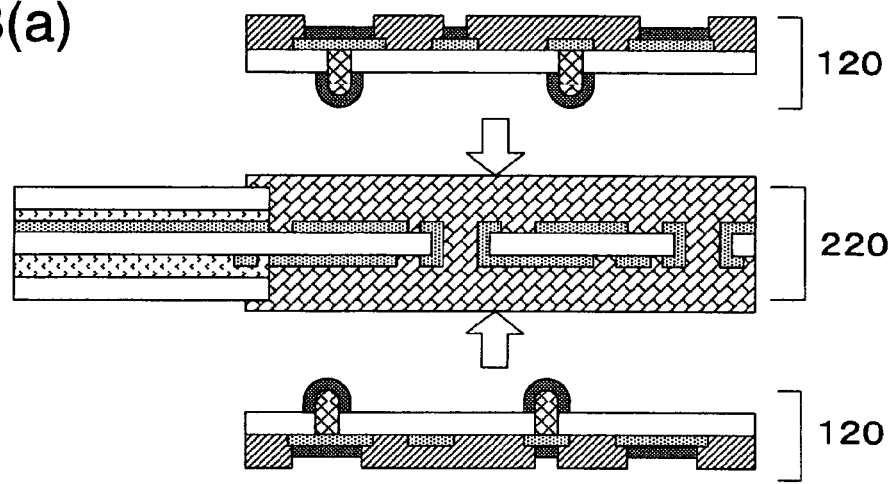
FIGS. 3(a) and 3(b) are the sectional views for illustrating a multilayer flexible wiring board of a four-layer structure according to the present invention and a process for producing it.
Figure 3B:
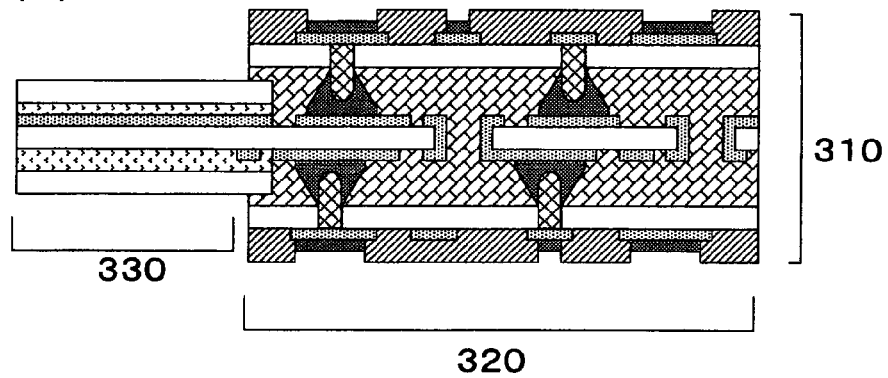
Figure 5A:
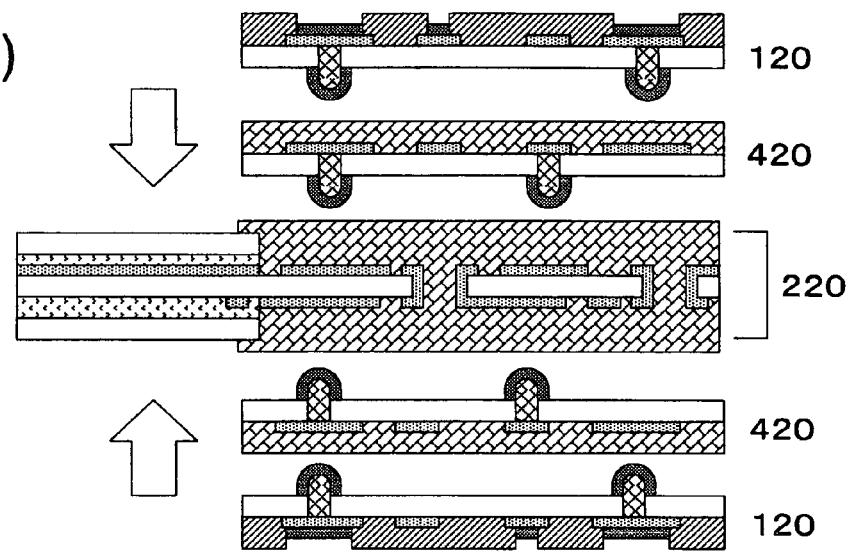
FIGS. 5(a) and 5(b) are the sectional views for illustrating a multilayer flexible wiring board of a six-layer structure according to the present invention and a process for producing it.
Figure 5B:
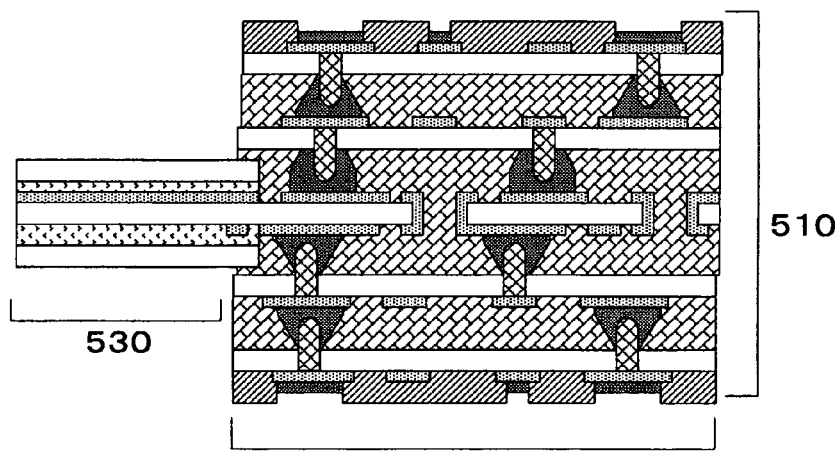

In the foregoing, the structure of a multilayer flexible wiring board having its multilayer portion comprised of four layers has been described with reference to FIGS. 1 to 3, but the embodiments of the present invention include a two-layer structure in which the pads are provided on one side alone of an interlayer flexible wiring board, with one individual piece of outer layer single-sided wiring board being laid on each of the said pads, and a three-layer structure in which the interlayer flexible wiring board is double-sided. The four- or more layered flexible wiring boards having the individual pieces of one-sided wiring board laid up successively are also included in the embodiments of the present invention. In the following, a multilayer flexible wiring board with its multilayer portion composed of six layers is explained.

In the case of the six-layer structure, the one-sided wiring boards 120 forming the outermost layers and the interlayer flexible wiring board 220 forming the center layer are the same as those used in the four-layer structure, but an interlayer single-sided wiring board 420 is formed as the layer disposed between each outermost layer and the center layer in the step D (FIG. 4).

A process for making the interlayer single-sided wiring board 420 in the step D comprises the following procedure. A single-sided laminate 410 is prepared by attaching a copper foil 401 on one side of a substrate 402 made of an insulating material obtained by curing a resin such as polyimide or epoxy resin (FIG. 4(a)). In this operation, in order to prevent smearing which becomes an obstacle to conductor connection, it is preferable not to allow presence of an adhesive layer between the substrate and the copper foil for bonding them although use of an adhesive for bonding is possible in the concept of the present invention. Then openings 403 are formed in the substrate 402 to the extent that the copper foil 401 is exposed (FIG. 4(b)). Such openings can be easily formed by the laser method which also allows formation of holes of small diameters. It is also preferable to remove the resin remaining in the substrate openings 403 by such a method as dry desmearing using an aqueous solution of potassium permanganate or plasma dry desmearing as this contributes to the enhancement of reliability of interlaminar connection. In each of these substrate openings 403, a two-layer conductor post 405 is formed projecting from the substrate 402 surface (FIG. 4(d)). The two-layer conductor post 405 can be formed by first forming a copper post 404 by a pasting or plating method (FIG. 4(c)) and then coating it with a metal or an alloy. As the metal, at least one of gold, silver, nickel, tin, lead, zinc, bismuth and antimony is used, and the post may be either single layered or may have a structure of two or more layers. The alloy used here is a solder composed of two or more metals selected from tin, lead, silver, zinc, bismuth, antimony and copper. For instance, tin-lead, tin-silver, tin-zinc, tin-bismuth, tin-antimony, tin-silver-bismuth and tin-copper alloys can be used, but the solder used in the present invention is not restricted by the metal combination or composition and any optimal alloy can be selected for use. Thickness of the post is 0.05 μm or greater, preferably 0.5 μm or greater. Then the copper foil 401 on one side of the substrate 402 is etched to form a wiring pattern 406 (FIG. 4(e)), and an adhesive layer 407 having a flux function is formed on this wiring pattern 406 (FIG. 4(g)). This adhesive layer having a flux function can be formed by printing, but it is more expedient to laminate a sheet of adhesive on the wiring pattern 406. This adhesive layer may be formed where necessary on the side having the pads for connection to the posts. Interposition of one such adhesive layer can secure connection between laminations. Finally, the work is properly cut according to the size of the multilayer portion to obtain an individual piece of outer layer single-sided wiring board 420 (FIG. 4(g)).

For forming a multilayer flexible wiring board 510 in the step E, the interlayer single-sided wiring boards 420 are laid up on the interlayer flexible wiring board 220, and the outermost layer single-sided wiring boards 120 are further laid up on the outside thereof.

The structures of seven or more layers can be obtained by laminating a required number of interlayer single-sided wiring boards 420.

The hot press bonding method for layer multiplication is not specifically defined in the present invention. For example, hot press bonding may be conducted each time the individual piece of interlayer flexible wiring board is laid up. Alternatively, all the individual pieces of outer surface single-sided wiring board may be laid up first, followed by hot press bonding of the whole laminated boards. As another method, the pads to be connected to the two-layer posts are soldered by applying heat exceeding the fusion point of the solder in the step of tentative bonding of the lay-up, and then the interlaminar adhesive is cured at a temperature below the fusion point to provide the desired laminate.

Example 1

Production of Outer Layer Single-Sided Wiring Board

A single-sided laminate 110 was formed by affixing a 12 μm thick copper foil 101 on one side of a 50 μm thick substrate 102 (SUMILITE APL-4001 produced by Sumitomo Bakelite Co., Ltd.) made of an insulating material comprising a cured epoxy resin. UV laser beams were applied to this laminate 110 from the substrate 102 side to form openings 103 with a diameter of 100 μm in the substrate 102, and they were subjected to a desmearing treatment with an aqueous solution of potassium permanganate. Then copper electroplating was applied to the inside of the substrate openings 103 to a build-up of 55 μm, followed by 5 μm thick solder plating to form the two-layer conductor posts 105. Then, the copper foil 101 of the single-sided laminate 110 was etched to form a wiring pattern 106, and after printing a liquid resist (SR9000W produced by Hitachi Chemical Co., Ltd.), a surface coating 107 was applied. Finally, the work was shaped to the regulated size of the laminate portion to obtain an outer layer single-sided wiring board 120.

(Production of Interlayer Flexible Wiring Board)

A two-layer double-sided board 210 (NEX23FE (25T) produced by Mitsui Chemical Co., Ltd.) consisting of the 12 μm thick copper foils 201 and a 25 μm thick polyimide film was bored by a drill, and after applying direct plating, through-holes 203 were formed by copper electroplating to make the front and back sides of the board electrically conductive. Then a wiring pattern and the pads 204 capable of receiving the two-layer conductor posts 105 were formed by etching. Thereafter, a surface coating 206 was formed on the part of the wiring pattern 205 corresponding to the flexible portion 330 by applying thereto a 25 µm thick polyimide (APICAL NPI produced by Kanegafuchi Chemical Industry Co., Ltd.) and a 25 µm thick heat-hardening adhesive (a material developed by our company). Further, a 20 µm thick heat-hardening adhesive sheet having a flux function (Interlaminar Adhesive Sheet RCF produced by Sumitomo Bakelite Co., Ltd.) was laminated on the part of the wiring pattern 204 corresponding to the multilayer portion 320 to form an adhesive layer 207 having a flux function, thereby constituting a sheet-sided interlayer flexible wiring board 220.

(Production of Multilayer Flexible Wiring Board)

The outer layer single-sided wiring boards 120 were laid up on both sides of the interlayer flexible wiring board 220 by using a fixture having the positioning pin guides. Then, after tentative bonding by a vacuum press laminator at 130° C. under 0.2 MPa for 60 seconds, the work was pressed by a hydraulic press at 260° C. under 0.02 MPa for 30 seconds. The two-layer conductor posts 105 were soldered to the pads 204 of the interlayer flexible wiring board 220 with the interposition of the adhesive layer 207 having a flux function to form a metal bond, and then the assembly was heated at 150° C. for 60 minutes to obtain a layer-built (multilayer) flexible wiring board 310.

Example 2

Multilayer flexible wiring boards were obtained in the same way as in Example 1 except that in producing the outer layer single-sided wiring boards, the two-layer conductor posts 105 were formed by changing the diameter of the substrate openings 103 down to 50 µm at the smallest.

Example 3

A multilayer flexible wiring board was obtained in the same way as in Example 1 except that solder plating was applied on the part of the wiring pattern 204 corresponding to the multilayer portion 320 of the interlayer flexible wiring board.

Comparative Example 1

A multilayer flexible wiring board was obtained in the same way as in Example 1 except that a surface coating 206 was formed on the entirety of the wiring pattern of the interlayer flexible wiring board 220, that the openings in the surface coating serving as the pads for receiving the conductor post 105 were formed by $CO_2$ laser, and that a step of applying a desmearing treatment was added.

Comparative Example 2

A multilayer flexible wiring board was obtained in the same way as in Example 1 except that the adhesive sheet 207 having a flux function of the interlayer flexible wiring board 220 was replaced by an ordinary adhesive sheet (PYRALUX LF100 produced by Du Pont) having no flux function.

In the multilayer flexible wiring boards of Examples 1 to 3, interlaminar connection was secured by metal to metal bonding, and in the temperature cycle test, there took place no disconnection and the bonded condition at the metal joint was good. Also, no rise of insulation resistance was observed in the insulation resistance test. Further, by cutting the outer layer single-sided wiring board into an individual piece, the positional accuracy of the lamination was enhanced in comparison to the sheet-like lamination, resulting in an improved yield. In the case of Comparative Example 1, however, the yield of the multilayer flexible wiring board lowered and the production and material costs elevated. In Comparative Example 2, metallic bond could not be made between the two-layer posts and their receiving pads.

INDUSTRIAL APPLICABILITY

According to the present invention, high-reliability connection can be made at the metallic joints in a wiring board laminate by use of an interlaminar bonding agent having a function to clean the metal surface, and since there exist no connecting holes such as through-holes in the surface of the outer layer single-sided wiring board, it is possible to realize high-density circuit wiring or high-density packaging of parts. Further, by laminating the individual pieces of wiring boards, it becomes possible to laminate the non-defective boards alone and to produce the multilayer flexible wiring boards in a high yield.

The invention claimed is:

1. A multilayer wiring board comprising (i) a plurality of single-sided wiring boards having a wiring pattern formed on one side of a substrate made of an insulating material and two-layer conductor posts made of copper and a metal or copper and an alloy, each of said conductor posts projecting from said wiring pattern to a side of said substrate opposite from said wiring pattern, with each substrate other than that of an outermost layer having, on the side opposite from said conductor posts, a plurality of pads for making connection to the conductor posts, and said wiring pattern having no surface coating, (ii) a flexible wiring board having on at least one side thereof the pads for connection to said conductor posts and comprising a wiring pattern with surface coating applied on a flexible portion but substantially no surface coating applied on a multilayer rigid portion, and (iii) an adhesive layer having a flux function whereby respective boards are laminated integrally, forming the multilayer rigid portion, wherein said conductor posts and pads are connected by a metal or an alloy through the medium of said adhesive layer, and said wiring patterns are electrically connected.

2. A multilayer flexible wiring board according to claim 1 wherein said flexible wiring board is a severed individual piece.

3. A multilayer flexible printed wiring board according to claim 2 wherein the metal is at least one of gold, silver, nickel, tin, lead, zinc, bismuth, antimony and copper.

4. A multilayer flexible printed wiring board according to claim 2 wherein the alloy comprises at least two of tin, lead, silver, zinc, bismuth, antimony and copper.

5. A multilayer flexible printed wiring board according to claim 1 wherein the metal is at least one of gold, silver, nickel, tin, lead, zinc, bismuth, antimony and copper.

6. A multilayer flexible printed wiring board according to claim 5 wherein the alloy comprises at least two of tin, lead, silver, zinc, bismuth, antimony and copper.

7. A multilayer flexible printed wiring board according to claim 1 wherein the alloy comprises at least two of tin, lead, silver, zinc, bismuth, antimony and copper.

* * * * *